United States Patent [19]

Roteman

[11] 3,977,874

[45] Aug. 31, 1976

[54] EPOXY RESIN PHOTORESIST WITH IODOFORM AND BISMUTH TRIPHENYL

[75] Inventor: Jerome Roteman, Solon, Ohio

[73] Assignee: American Can Company, Greenwich, Conn.

[22] Filed: Feb. 26, 1975

[21] Appl. No.: 553,264

Related U.S. Application Data

[62] Division of Ser. No. 369,086, June 11, 1973, Pat. No. 3,895,954.

[52] U.S. Cl. .................................. 96/35.1; 96/36; 96/115 P; 204/159.18; 204/159.23; 204/159.24; 427/43
[51] Int. Cl.$^2$ ..................... G03C 5/00; G03C 1/68; C08F 2/46; C01Y 1/19
[58] Field of Search ............ 96/115 P, 115 R, 86 P, 96/35.1, 36; 204/159.18, 159.23, 159.24; 260/2 EP, 2 EC, 47 A, 47 EC; 427/43

[56] References Cited
UNITED STATES PATENTS

| | | | |
|---|---|---|---|
| 3,427,259 | 2/1969 | Garty et al. | 260/2 EP |
| 3,522,194 | 7/1970 | Hada et al. | 260/47 A |
| 3,708,296 | 1/1973 | Schlesinger | 95/115 P |
| 3,711,391 | 1/1973 | Feinberg | 96/115 P |
| 3,720,634 | 3/1973 | Statton | 260/47 EC |
| 3,721,617 | 3/1973 | Watt | 260/2 EP |

*Primary Examiner*—Jack P. Brammer
*Attorney, Agent, or Firm*—Robert P. Auber; Ernestine C. Bartlett; George Ziehmer

[57] ABSTRACT

Photopolymerizable compositions and processes for photopolymerizing such compositions are provided, said process comprising admixing with said epoxides, photosensitive organohalogen compounds in combination with an organometallic compound and thereafter applying energy to the resulting mixture. The organohalogens decompose to liberate an active catalyst which then serves to initiate polymerization of the epoxide material. The organometallic compound functions synergistically with the organohalogen to enhance the film forming properties of the resulting polymer and or sensitivity of the polymerizable system.

11 Claims, No Drawings

EPOXY RESIN PHOTORESIST WITH IODOFORM AND BISMUTH TRIPHENYL

This is a division of application Ser. No. 369,086, filed June 11, 1973, now U.S. Pat. No. 3,895,954.

BACKGROUND OF THE INVENTION

It had heretofore been known in isolated instances in the literature that epoxy monomers may be polymerized by the action of electromagnetic radiation. For example, Penezek et al. in *Die Makromolekular Chemie*, 97 (1966) have reported that gamma radiation will effect polymerization of cyclohexene oxide. However, this type of reaction does not generally occur with most epoxy monomers. Additionally gamma radiation is not a convenient source of radiation and not as useful as the ultraviolet and visible regions of the spectrum. Therefore, for quite some time now, polymerization of epoxy monomers has been carried out by heating to high temperatures the monomer in which a chemical compound was incorporated, until catalysts contained therein were activated. The activation of the catalyst upon heating thereby initiated polymerization of the epoxy monomers. These methods, though successful, are unsatisfactory in that careful attention must be given to staying within the temperature limitations of the system involved. In order to prevent the harmful effects of heat curing, it is often necessary to extend the curing cycle an unreasonable length of time.

More recently, it has been discovered that epoxides may be photopolymerized employing aryl diazonium salts as photo-sensitive precursors. Such a procedure forms the subject matter of U.S. Pat. No. 3,708,296 issued Jan. 2, 1973 to Sheldon I. Schlesinger.

It has recently been discovered that another class of compounds, the organohalogens, are effectively photosensitive to initiate photopolymerization of epoxides and such compounds offer a viable and attractive alternative to the use of aryl diazonium catalysts. Such discovery is disclosed and claimed in copending U.S. application Ser. No. 369,007 filed June 11, 1973, and now abandoned, commonly assigned herewith by S. Schlesinger entitled "Organohalogen Compounds As Photoinitiators of Epoxy Photopolymerization".

Organohalogens have been known for some time as free-radical initiators in photopolymerization processes where polymerization is initiated via the double bonds of an unsaturated compound. Free-radical polymerizations however are known to suffer in general from the undesirable characteristic that the polymerization is subject to inhibition by molecular oxygen. Also free radical inhibitors such as 4-methoxyphenol are often added to prevent premature polymerizations of coating mixtures stored in the dark.

It has now been discovered that the photopolymerization of epoxide materials employing organohalogen compounds as photoinitiators is enhanced synergistically when such polymerization is effected in the presence of an organometallic compound containing a Group V metal as described herein. Moreover, it has been discovered that such organometallic compounds when combined with organohalogens function synergistically to enhance the film forming properties of the polymer formed and/or enhances the sensitivity of the polymerizable system.

The above discovery of the effectiveness of organohalogen-organometallic systems in the polymerization of cationically polymerizable epoxides is surprising in view of the known tendency of organohalogens to form free-radicals on exposure to radiation and the difficulties normally experienced with free-radical initiated polymerization taken together with the fact that epoxides are known to be polymerizable through a cationic mechanism. Indeed, workers in the art have reported that organohalogen compounds are ineffective for such cationic polymerizations. See for example, Cripps et al., U.S. Pat. No. 3,347,676 issued Oct. 17, 1967, wherein polychlorinated biphenyls were ineffective to initiate photopolymerization of cationically initiated monomers. Another example is Smith, U.S. Pat. No. 3,515,552 issued June 2, 1970, which discloses that a specific class of compounds, e.g., vinyl ethers characterized by undergoing more rapid polymerization than other cationically polymerizable materials, were photopolymerized with organohalogen initiators. In this procedure, however, polymerization takes place via the double bonds in the vinyl ethers. To date, there has been no procedure which recognized that epoxide compounds, polymerizable cationically through the opening of oxirane rings rather than through double bonds, could be effectively photopolymerized employing organohalogen compounds in combination with organometallic compounds.

SUMMARY OF THE INVENTION

Accordingly, the present invention relates to photopolymerizable compositions comprising an epoxide material polymerizable to higher molecular weights and, as a latent catalyst precursor therefor, an organohalogen compound which decomposes upon application of energy to release an active catalyst which effects the polymerization in combination with an organometallic compound which enhances the film-forming properties of the polymer and the sensitivity of the polymerizable system and to processes for effecting such polymerization.

DETAILED DESCRIPTION OF THE INVENTION

Thus, in accordance with the procedure of this invention, a mixture is formed of an epoxide material in admixture with an organohalogen compound as a latent catalyst precursor and an organometallic compound in which the metal is a member of Group V of the Periodic Chart as an enhancer therefor. The composition at a convenient time subsequently is exposed to electromagnetic radiation or other energy sources to release an active catalyst or catalysts which effects the polymerization of the epoxide material.

The Organohalogens

Any organic halogen compound that decomposes under the action of suitable energy sources for example, electromagnetic radiation, to release an active catalyst effective to initiate polymerization of the epoxide material, and in which the halogen is of an atomic number of 9 – 53, e.g., fluorine, chlorine, bromine, and iodine, may be employed herein.

The organohalogen is believed to decompose under the action of such energy to liberate halogen atoms as shown in equation 1, utilizing carbon tetrabromide, for example:

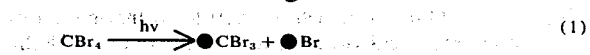

(1)

The halogen is then believed to initiate polymerization of the epoxide by either or several of:
A. Abstracting a hydrogen atom from a solvent or the monomer to form an acid (HX) or
B. Reacting with a metal, for example, a metal substrate to which the composition is applied, to form a Lewis acid halide or
C. Acting as a Lewis acid by itself to initiate polymerization.

Preferably, the compound will exhibit bond dissociation energies for the carbon to halogen bond of between about 40 and 70 kilogram calories per mole or less and especially 60 kilogram calories per mole or less. In general, organic bromides and iodides require less energy to dissociate, provide stronger acids upon dissociation, and are preferred herein for these reasons. Similarly, aliphatic halides require less energy for bond dissociation than aromatic halides, while polyhalogenated compounds provide more available halides per mole of compound than monohalides. Accordingly, the most preferred compounds for use herein will be polyhalogenated aliphatic bromides or iodides or polyhalogenated aliphatic chains as substituents on aromatic rings.

Although the above discussed compounds are preferred, many and various organohalogens may be employed in which the organic radicals are alkyl, aryl, aralkyl, alkaryl, alkoxy, aroxy, heterocyclic, organometallic, etc., as long as they are compatible with the epoxide component of the system and function to release an active catalyst in accordance with the invention.

The following illustrative organohalogen compounds may be employed as components of the photopolymerizable compositions herein: carbon tetrabromide; tetra(bromomethyl) methane; tetrabromoethylene, 1,2,3,4-tetrabromobutane; trichloroethoxyethanol; p-iodobenzene; bromobenzene; iodoform; p-bromophenol; p-iodobiphenyl; N-bromosuccinimide; α,α'-dibromo-p-xylene; phenylquinaldinium iodide; phenylchromium iodide-chloroform complex, (C$_6$H$_5$) Cr·I·2CHCl$_3$; chloroform; bromoform; 2,6-dibromophenol; 1-bromo-2-naphthol; p-bromoaniline; hexachloro-p-xylene; trichloroacetanilide; p-bromodimethylaniline; tetrachlorotetrahydronaphthalene;α,α,α',α'-tetrabromoxylene; hexabromoethane; hexabromocyclohexane; tetrafluoroethylene; hexafluoroethane; etc.

The Epoxide

Any monomeric or prepolymeric material, or mixture of such materials, of suitable viscosity or suitable miscibility in solvents, which is polymerizable to higher molecular weights through the action of a cationic catalyst, may be utilized in the process and compositions of the present invention. In a preferred embodiment, any polymerizable, monomeric or prepolymeric epoxide material or mixture of such epoxide materials, of suitable viscosity alone or when dissolved in a suitable solvent, may be utilized. The classic epoxy resin is obtained by the well known reaction of epichlorohydrin and bisphenol A (4,4'-isopropylidenediphenol). The reaction product is believed to have the form of a polyglycidyl ether of bisphenol A (the glycidyl group being more formally referred to as the 2,3-epoxypropyl group) and this may be thought of as a polyether derived from the diphenol and glycidol (2,3-epoxy-1-propanol). The structure usually assigned to the resinous product is

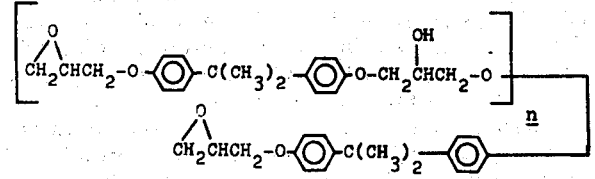

a viscous liquid epoxy resin, average molecular weight about 380, is obtained by reacting the epichlorohydrin in high molecular proportion relative to the bisphenol A, the reaction product containing well over 85 mole per cent of the monomeric diglycidyl ether of bisphenol A ($n=0$), which may be named 2,2-bis[p-(2,3-epoxypropoxy)phenyl]propane, and smaller proportions of polymers in which $n$ is an integer equal to 1, 2, 3, etc. This product exemplifies epoxide monomers and prepolymers, having a moderate molecular weight, preferably of the order of 1,000, or less, which may be crosslinked or otherwise polymerized in accordance with the invention, whereby cleavage of the terminal epoxy or oxirane rings is initiated by the action of the active catalyst released when energy is applied to the latent polymerization catalyst.

Many other epoxide materials are available in polymerizable monomeric or prepolymeric forms. Among these are 1,2-epoxycyclohexane (cyclohexene oxide, also named 7-oxabicyclo-[4.1.0]heptane); and vinylcyclohexene dioxide, more specifically named 3-(epoxyethyl)-7-oxabicyclo[4.1.0]-heptane or 1,2-epoxy-4-(epoxyethyl)cyclohexane. Ethylene oxide (oxirane,

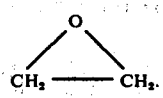

the simplest epoxy ring)
and its homologues generally, e.g., propylene oxide (1,2-epoxypropane) and 2,3-epoxybutane, are themselves useful; other useful epoxidic cyclic ethers are the C$_3$O ring compound trimethylene oxide (oxetane), derivatives thereof such as 3,3-bis(chloromethyl)oxetane (also named 2,2-bis(chloromethyl)-1,3-epoxypropane), and the C$_4$O ring compound tetrahydrofuran, as examples. Other epoxidized cycloalkenes may be used, a readily available polycyclic diepoxide being dicyclopentadiene dioxide, more specifically identified as 3,4-8,9-diepoxytricyclo[5.2.1.0²·⁶]decane. A suitable polyfunctional cyclic ether is 1,3,5-trioxane.

Glycidyl esters of acrylic acid and of its homologs, methacrylic acid and crotonic acid, are vinyl epoxy monomers of particular interest. Other such monomers are allyl glycidyl ether (1-allyloxy-2,3-epoxypropane) and copolymers thereof with glycidyl methacrylate particularly as disclosed and claimed in co-pending U.S. Application, Ser. No. 297,829 filed Oct. 16, 1972, as well as glycidyl phenyl ether (1,2-epoxy-3-phenoxypropane). Another readily available product is a mixture of ethers of the structure

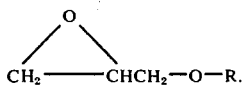

where R is alkyl, that is, glycidyl alkyl ethers. One such mixture contains predominantly glycidy octyl ether and decyl glycidyl ether; another contains dodecyl glycidyl ether and glycidyl tetradecyl ether. Epoxidized novolak and epoxy cresol novolak prepolymers likewise may be used, as well as polyolefin (e.g. polyethylene) epoxides. The latter are exemplified by epoxidized, low molecular weight by-products of the polymerization of ethylene, which may be separated as mixtures high in 1-alkenes in the range from about 10 to 20 carbon atoms, that is from about 1-decene to about 1-eicosene. Epoxidation then provides mixtures of the corresponding 1,2-epoxyalkanes, examples being mixtures high in the 1,2-epoxy derivatives of alkanes having 11 to 14 carbons, or having 15 to 18 carbons.

Esters of epoxidized cyclic alcohols, or of epoxidized cycloalkanecarboxylic acids, or of both, provide useful epoxide or polyepoxide materials. Thus a suitable ester of epoxidized cyclohexanemethanol and epoxidized cyclohexanecarboxylic acid is the diepoxide (3,4-epoxycyclohexyl)methyl 3,4-epoxycyclohexanecarboxylate. Another suitable diepoxide may be obtained as an ester of a substituted (epoxycycloalkyl)methanol and a dibasic acid, for example, bis[3,4,-epoxy-6-methylcyclohexyl)methyl] adipate, which may be named alternatively bis[4-methyl-7-oxabicyclo-[4.1.0]hept-3-yl)methyl] adipate. Diepoxide monomeric materials may be obtained conveniently as bis(epoxyalkyl) ethers of glycols, an example being the diglycidyl ether of 1,4-butanediol, that is, 1,4-bis-(2,3-epoxypropoxy)-butane. This diepoxide is related to the diglycidyl ether of bisphenol A, shown above as 2,2-bis[p-2,3-epoxypropoxy)phenyl]propane.

The Organometallic Compound

The organometallic compounds suitable for use herein may be represented by the formula:

$$R_3 M$$

wherein M is a metal selected from Group V of the Periodic Chart of the Elements including P, As, Sb and Bi; R is an organic radical, preferably hydrocarbyl such as alkyl, aryl, alkaryl, aralkyl, cycloalkyl, alkcycloalkyl, etc. or hydrogen with the proviso that at least one R is an organic radical.

Exemplary of compounds represented by the formula are organophosphines such as tricyclohexylphosphines, trioctyl phosphine, diphenyl cyclohexyl phosphine, tributyl phosphine, trihexenyl phosphine, trixylyl phosphine, triethyl phosphine, dicyclohexyl phosphine, cyclohexyl phosphine, trihexyl phosphine and triphenyl phosphine; organobismuthines such as trixylyl bismuthine, triphenyl bismuthine, tributyl bismuthine, tricyclohexyl bismuthine, tridecyl bismuthine, diphenyl octyl bismuthine ethyl ditolyl bismuthine, etc.; organoarsines such as tricyclohexyl arsine, triphenyl arsine, trioctyl arsine, diphenyl butyl arsine, trixylylarsine, tridecyl arsine, dicyclohexyl arsine, tricyclohexyl arsine, etc. organostibines such as triphenyl stibene, tridodecyl stibene, tributyl stibene, dicyclohexylstibine, tri (2-ethylhexyl)stibine, etc.

Especially preferred for use herein are such compounds containing tri (aryl) groups with triphenyl bismuthine being the most preferred compound.

The exact mechanism by which the organometallic compounds function to enhance the sensitivity and film forming properties in the polymerizable system is not known. It is possible that the photolysis product of the organohalogen compound combines with the organometallic compound in some way to function as it does. However, the beneficial results of the present invention are useful without regard to the theoretical explanation for the phenomena. As illustrated further hereinbelow, the organometallic compound does not function to initiate photopolymerization of the polymerizable material in the absence of an organohalogen. Yet, when combined therewith, such compounds exert a decided synergistic effect.

A general application of the process of the invention can be as follows: the photopolymerizable composition as heretofore defined is admixed in a suitable medium and, for instance, in one embodiment of the invention, the mixture is thereafter coated on a suitable substrate such as metal plate, plastic or paper, and the substrate is exposed to an energy source. On exposure, the catalyst precursor or precursors decompose to release an active catalyst which initiates the polymerization of the epoxy monomer. The resulting polymer is resistant to most solvents and chemicals.

The source of radiation for carrying out the method of the present invention can be any suitable source, such as the ultraviolet actinic radiation produced from a mercury, xenon, or carbon arc, or the electron beam produced in a suitably evacuated cathode ray gun. The only limitation placed on the radiation source used is that it must have an energy level at the irradiated film sufficient to impart to the polymerizable system energy at an intensity high enough to reach the decomposition level of the photosensitive compounds. As previously noted, the wavelength (frequency) range of actinic radiation is chosen to obtain sufficient absorption of energy to excite the desired decomposition.

For an imaging system, the mixture, which may contain a suitable solvent in substantial proportions, is coated on a metal plate, dried if necessary to remove solvent present, and the plate is exposed to ultraviolet light through a mask or negative. The light initiates polymerization which propagates rapidly in the exposed image areas. The resulting polymer in the exposed areas is resistant to many or most solvents and chemicals, while the unexposed areas can be washed with suitable solvents to leave a reversal image of the polymer in this embodiment.

The polymers produced by the polymerizing process of the present invention are useful in a wide variety of applications in the field of graphic arts, due to their superior adhesion to metal surfaces, excellent resistance to most solvents and chemicals, and capability of forming high resolution images. Among such uses are photoresists for chemical milling, gravure images, offset plates, stencil-making, microimages for printed circuitry, thermoset vesicular images, microimages for information storage, decoration of paper, glass, and packages, and light-curable coatings.

The procedures for mixing the radiation-sensitive compositions of the present invention are relatively simple. The polymerizable mixture is combined with the organohalogen and organometallic compounds with a suitable inert volatile solvent. By such a suitable inert solvent is meant any solvent which does not react appreciably in the dark with the epoxide material and catalyst precursor. Examples of such solvents include acetone, acetonitrile, toluene, xylene, methyl ethyl ketone, ethylene glycol, monomethyl ether, ethyl ether, dimethyl ether of diethylene glycol, monochlorobenzene, tetrachloroethane, trichloroethylene, 1,1,2,2-tetrachloroethane, o-chlorotoluene, o-dichlorotoluene or mixtures thereof. It will be apparent from a reading of the solvents listed that many of the organohalogens suitable as catalyst precursors are also solvents for the compositions. Thus, these halogen-containing solvents may not be strictly considered as inert since traces left in the dried coating would act as additional halide photoinitiators. However, until exposed to light, e.g. in the dark, such compounds are inert and suitable for use as solvents.

The amounts of organohalogen compounds employed should be sufficient to insure complete polymerization. It has been found that quite satisfactory results are obtained by providing an organohalogen compound in amounts by weight of from about 5% to about 50% relative to the weight of the polymerizable epoxide material, about 2% or less being amply effective with some monomer-catalyst systems.

The organometallic compounds are employed in amounts relative to the amount of organohalogen employed. In general, such amounts may vary from 1 to 3 cmoles organometallic compound per mole of organohalogen.

It may be desirable to include in the composition an inert pigment or filler, which may be present in even a major proportion by weight. Inclusion of such inert materials usually makes advisable a proportionate increase in the optimum amount of organohalogen and organometallic compound needed. Nevertheless, the amount of these compounds rarely exceeds 50% of the entire weight of the composition.

The following examples will serve to further illustrate the present invention.

EXAMPLE I

Two solutions designated "A" and "B" were formulated to contain the following components:

| Part A | |
|---|---|
| Bisphenol A glycidyl ether polymer (Epon 1009) | 21.7g |
| Methyl ethyl ketone | 16.2g |
| Toluene | 16.2g |
| Part B | |

| -continued | |
|---|---|
| Methyl ethyl ketone | 32.8g |
| Iodoform | 9.8g |
| Triphenylbismuthine | 3.3g |

The two parts were then mixed together and applied as a coating with a No. 12 Mayer rod onto a silicate coated aluminum offset plate. The resultant coating was allowed to dry in air in the dark after which it was exposed through a Kodak No. 2 step tablet (this type of tablet has 21 continuous tone steps varying from optical densities of 0.05 to 3.05) at 18 cm. distance from a Gates Raymaster 360 Watt Uviarc mercury lamp for 5 minutes and then heated at 110°C for 3 minutes. When developed in methyl ethyl ketone by immersing the exposed plate therein and rubbing with cheesecloth, a length of cured epoxy coating remained on the strip as a negative image, corresponding to the first six steps of the step tablet.

The same experiment employing Redicote aluminum offset plate as the base substrate reproduced seven steps.

EXAMPLE II

The following formulations were prepared:

A. 10.g. 50% ECN 1299 (an epoxy cresol novolak resin) in o-chlorotoluene
  1.0g. iodoform
  6 ml. acetonitrile B. 10g. 50% ECN 1299 in o-chlorotoluene
  1.0g. iodoform
  6 ml. acetonitrile
  0.336g. triphenylbismuthine C. 10.g. 50% ECN 1299 in o-chlorotoluene
  6 ml. acetonitrile
  1.0g. triphenylbismuthine D. 10.0g. 50% ECN 1299 in o-chlorotoluene
  6 ml. acetonitrile
  1.34g. bismuthtriiodide The above formulations were coated onto aluminum plate following the procedure of Example I and dried overnight in the dark.

Two types of tests were conducted: one to determine if crosslinking took place under various conditions and the other to determine to what extent crosslinking took place. Specifically, the samples were 1. heated for 5 minutes at 110°C and developed in trichloroethylene or
2. exposed for 5 minutes to a Gates Raymaster Uviarc 360 W mercury lamp through a mask or screen to leave portions unexposed and developed in trichloroethylene or
3. exposed as in (2) above for 5 minutes, heated for 3 minutes at 110°C and developed in trichloroethylene or
4. exposed for 5 minutes under a Kodak No. 2 continuous tone 21 step tablet in contact frame and developed in trichloroethylene or
5. exposed as in (4) above, heated for 3 minutes at 110°C and developed in trichloroethylene.

All exposures were done at 19cm. distance from the light source.

The results are summarized in Table I.

TABLE I

Results of Treatments After Development

| Formulation, Additive | Δ 110°C, 5 min. | 5 min. hv | 5 min. hv 3 min. Δ 110°C | 5 min. hv, Step Tablet | 5 min. hv- Step Tablet, 3 min. Δ, 110°C |
|---|---|---|---|---|---|
| CHI₃ | All of Coating Washed Off, No Cure | Hard Coating in exposed area | Hard Coating in exposed area | 1 Step | 2 Steps |
| CHI₃ and Bi (φ)₃ | " | " | " | 3 Steps | 5 Steps |
| Bi (φ)₃ | " | All of Coating Washed Off, No Cure | All of Coating Washed Off, No Cure | All of Coating Washed Off, No Cure | All of Coating Washed Off, No Cure |
| BiI₃ | " | " | " | " | " |

It will be apparent from the results of the experiments reported in the Table that the combination of iodoform and triphenylbismuthine functions synergistically in forming a cured photopolymer. It will also be apparent that triphenylbismuthine and bismuth triiodide are not initiators of such crosslinking either thermally or photolytically.

EXAMPLE III

Part A

The following formulation was prepared:

| | |
|---|---|
| 50% ECN 1299 in o-chlorotoluene | 10.8g. |
| iodoform | 2.44g. |
| methyl ethyl ketone | 6.8g. |
| toluene | 4.0g. |

Samples of uncoated Redicote aluminum offset plate were coated with this formulation and allowed to dry in the dark.

A sample was exposed through a No. 2 Kodak step tablet to a 360W mercury arc for 5 minutes, heated at 110°C for 5 minutes and developed in acetone. Three glossy steps, followed by four dull very thin steps were reproduced.

Another sample was exposed for 2½ minutes through a half-tone and line image transparency, and then heated for 5 minutes at 110° before final development in acetone. A negative photopolymer reproduction of the transparency image remained on the plate.

Part B

The experiments were repeated except that 0.885g of triphenylbismuthine were added to the above formulation.

After exposure, heating and development as in Part A above, six glossy steps were reproduced.

The sample exposed 2½ minutes through a half-tone and heated as in Part A above also yielded a negative photopolymer reproduction of the image which was of better resolution and clarity than obtained in Part A.

EXAMPLE IV

Formulation A

| | |
|---|---|
| 59.5% Araldite 7097 in methyl ethyl ketone | 3.65g. |
| methyl ethyl ketone | 3.42g. |
| toluene | 1.6g. |
| iodoform | 0.9g. |

Formulation B

Same as formulation A except that 0.33g of triphenylbismuthine was also present.

The above formulations were applied to an aluminum plate exposed as in Example I and developed in methyl ethyl ketone.

A sample strip with formulation A reproduced 4 steps of the step tablet while the strip with formulation B reproduced 5 steps which were both thicker and sharper in definition than that obtained with formulation A.

EXAMPLE V

Two formulations were prepared to contain:

A. 3.62g allylglycidyl ether-glycidyl methacrylate copolymer
2.7g toluene
8.2g methyl ethyl ketone
11.63g iodoform
B. Same as formulation A to which 0.55g triphenyl bismuthine is added.

Separate coatings were made on redi-cote aluminum using a No. 12 Mayer rod.

Sample strips were exposed through a No. 2 step tablet for 30 seconds and then developed in methyl ethyl ketone. The coating with iodoform alone reproduced 15 steps while the coating with triphenyl bismuthine also present reproduced 17 steps. Both coatings could be dyed with a trichloroethylene solution of Orasol black.

When similarly exposed to a Xenon lamp for 15 seconds and developed, the two coatings yielded 5 and 8 steps respectively.

EXAMPLE VI

A coating was cast on an aluminum plate from a mixture consisting of 10.8g Epon 1009 in methyl ethyl ketone, 2.7g toluene, 1.0g carbon tetrabromide and 0.336g triphenyl bismuthine and C.P. No. 4, a triphenylmethane leuco dye. After drying, part of the coated surface was exposed to actinic light for 5 minutes. The light source was a 360W Gates Raymaster Uviarc mercury lamp. Following exposure, the entire sample was heated for 10 minutes at 150°C. The unexposed portion of the coating, before development with acetone, was found to be water white while the exposed areas were blue. Upon development with acetone only the unexposed area washed off.

It is thought that the invention and many of its attendant advantages will be understood from the foregoing description and it will be apparent that various changes may be made in the matter of the ingredients, the identity and their proportions and in the steps of the process and their order of accomplishment without departing from the spirit and scope of the invention or sacrificing all of its material advantages, the form hereinbefore described being merely a preferred embodiment thereof.

What is claimed is:

1. A process for polymerizing a monomeric or prepolymeric epoxide material or mixtures thereof, which comprises:
    forming a mixture of a monomeric or prepolymeric epoxide material, or mixture thereof, polymerizable to higher molecular weights through the action of a cationic catalyst, with a radiation-sensitive catalyst precursor which decomposes upon exposure to electromagnetic or electron-beam radiation to provide an active catalyst effective to initiate polymerization of said epoxide material, said precursor being an organohalogen compound wherein the organo radicals are alkyl, aryl, alkaryl, aralkyl, alkoxy and aroxy in combination with an organometallic compound having the formula $R_3M$ wherein M is P, As, Sb or Bi and R is a hydrocarbyl radical or hydrogen with the proviso that at least one R is a hydrocarbyl radical;
    and subsequently exposing the resulting mixture to electromagnetic or electron beam radiation to release an active catalyst in sufficient amounts to effect substantial polymerization of the epoxide material.

2. The process of claim 1 in which the organometallic compound is triphenyl bismuthine.

3. The process of claim 2 in which the organohalogen is iodoform.

4. The process of claim 1, in which mixing of the epoxide, catalyst precursor and organometallic compound is effected by use of a solvent.

5. The process of claim 1, in which the mixture is exposed to electromagnetic radiation.

6. The process of claim 1, in which the mixture is exposed to electromagnetic radiation after which it is heated to an elevated temperature.

7. A process for polymerization of a monomeric or prepolymeric epoxide material which comprises:
    forming a mixture of a monomeric or prepolymeric epoxide material or mixture thereof, that is polymerizable to higher molecular weights through the action of a cationic catalyst, with a radiation-sensitive catalyst precursor which decomposes upon exposure to electromagnetic or electron-beam radiation to provide an active catalyst effective to initiate polymerization of said epoxide material, said precursor being an organohalogen compound wherein the organo radicals are alkyl, aryl, alkaryl, aralkyl, alkoxy and aroxy in combination with an organometallic compound having the formula $R_3M$ wherein M is P, As, Sb or Bi and R is a hydrocarbyl radical or hydrogen with the proviso that at least one R is a hydrocarbyl radical;
    Applying said mixture to a surface area;
    Screening predetermined portions of said surface area;
    exposing the unscreened surface area to electromagnetic or electron beam radiation to effect polymerization;
    removing said screening means; and thereafter applying a suitable solvent for removal of unpolymerized portions of said mixture.

8. The process of claim 7 wherein the organometallic compound is triphenylbismuthine.

9. The process of claim 8 wherein the catalyst precursor is iodoform.

10. The process of claim 7 wherein the energy applied is electromagnetic radiation.

11. The process of claim 7 wherein the energy applied is electromagnetic radiation and heat.

* * * * *